United States Patent
Berman et al.

(10) Patent No.: US 11,528,037 B1
(45) Date of Patent: Dec. 13, 2022

(54) HARDWARE ARCHITECTURE FOR LOCAL ERASURE CORRECTION IN SSD/UFS VIA MAXIMALLY RECOVERABLE CODES

(71) Applicant: SAMSUNG ELECTRONICS CO., LTD., Suwon-Si (KR)

(72) Inventors: Amit Berman, Binyamina (IL); Yaron Shany, Kfar Saba (IL); Ariel Doubchak, Herzliya (IL)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 17/351,107

(22) Filed: Jun. 17, 2021

(51) Int. Cl.
- *H03M 13/15* (2006.01)
- *G06N 3/04* (2006.01)
- *H03M 13/00* (2006.01)

(52) U.S. Cl.
CPC ........ *H03M 13/154* (2013.01); *G06N 3/0445* (2013.01); *H03M 13/616* (2013.01)

(58) Field of Classification Search
CPC . H03M 13/154; H03M 13/616; G06N 3/0445
See application file for complete search history.

(56) References Cited

U.S. PATENT DOCUMENTS

| | | | | |
|---|---|---|---|---|
| 7,756,992 B1 * | 7/2010 | Zhao | ...................... | H04L 63/145 709/231 |
| 8,942,120 B2 * | 1/2015 | Toshiaki | ............... | H04W 24/00 370/252 |
| 2020/0210816 A1 * | 7/2020 | Luo | ..................... | H03M 13/1102 |
| 2020/0234103 A1 * | 7/2020 | Luo | ........................ | H04L 1/0045 |
| 2021/0143840 A1 * | 5/2021 | Luo | .................... | H03M 13/6597 |

OTHER PUBLICATIONS

R. Gabrys et al., Constructions of Partial MDS Codes Over Small Fields, IEEE vol. 65. No. 6 pp. 3692-3791, Jun. 2019.

U.Martinez-Penas et al., Universal and Dynamic Locally Repairable Codes With Maximal Recoverability via Sum-Rank Codes, IEEE vol. 65. No. 12, pp. 7790-7805, Dec. 2019.

(Continued)

*Primary Examiner* — Thien Nguyen
(74) *Attorney, Agent, or Firm* — F. Chau & Associates, LLC

(57) ABSTRACT

A hardware architecture for systematic erasure encoding includes first matrix constructor circuit that receives parity-check matrix H for codeword C, and the erased part of codeword C, and outputs matrix $H_1$ of columns of H located on erased coordinates of code C; second matrix constructor circuit that receives matrix H and the erased part of codeword C and outputs matrix $H_2$ of columns of H located on non-erased coordinates of code C; a neural network that calculates matrix $J_1$ that is an approximate inverse of matrix $H_1$. The matrix $J_1$ is used to determine new erasures in the parity matrix H and new erased coordinates. Matrices $H_1$ and $H_2$ are updated, and the updated $H_1$ is provided as feedback to the first matrix constructor circuit. A calculator circuit restores the erased coordinates of codeword C, from the matrix $J_1$, matrix $H_2$, and a non-erased part of codeword C.

20 Claims, 3 Drawing Sheets

(56) References Cited

OTHER PUBLICATIONS

P. Gopalan et al., Explicit maximally recoverable codes with locality, IEEE Trans. Inform. Theory, vol. 60, No. 9, pp. 5245-5256, Sep. 2014.
R. Gabrys et al., Constructions of partial MDS codes over small fields, in Proc. ISIT 2017.
A. Leroy, Pseudo-linear transformations and evaluations in Ore extensions, Bull. Belg. Math. Soc. vol. 2, pp. 321-347, 1995.
T. Y. Lam et al., Vandermonde and Wronskian Matrices over division rings, J. Algebra, vol. 119 pp. 308-336, 1988.
T. Y. Lam el al., Wedderburn polynomials over division rings, I, J, Pure Appl. Algebra. vol. 186. pp. 43-76, 2004.
U. Martinez-Penas, Skew and linearized Reed-Solomon codes and maximum sum rank distance codes over any division ring, J. Al-gebra, vol. 504, pp. 587-612, 2018.
U.Martinez-Penas et al., Universal and dynamic locally repairable codes with maximal recoverability via sum-rank codes, arXiv:1809.11158v1 [cs.IT]Sep. 28, 2018).

\* cited by examiner

HARDWARE ARCHITECTURE FOR LOCAL ERASURE CORRECTION IN SSD/UFS VIA MAXIMALLY RECOVERABLE CODES

TECHNICAL FIELD

Embodiments of the disclosure are directed to improved algorithms for erasure correction codes.

DISCUSSION OF THE RELATED ART

In coding theory, erasure correction concerns the case where one knows the location of bit errors in a received codeword, but one cannot read the bit, so it is unknown whether the error bit is a one or a zero, but where one knows the values of the other bits. Conventional methods of error correction include a matrix inversion, where the computational complexity of inverting matrix A is of order O(dim (A)$^3$).

SUMMARY

According to an embodiment of the disclosure, there is provided a hardware architecture for systematic erasure encoding. The hardware architecture includes a first matrix constructor circuit that receives a parity-check matrix $H \in F_q^{(n-k) \times n}$ for an MR codeword C of length n and dimension k over a finite field $F_q$, where q is a prime power, and receives coordinates of an erased part of codeword C, and outputs a matrix $H_1 \in F_q^{(n-k) \times (n-k)}$ that is n-k columns of H located on erased coordinates of code C, a second matrix constructor circuit that receives the parity check matrix H and the coordinates of the erased part of codeword C and outputs a matrix $H_2 \in F_q^{(n-k) \times k}$ that is k columns of H located on non-erased coordinates of code C; a neural network that receives matrix $H_1$ and outputs a matrix $J_1$ that is an approximate inverse matrix $H_1$, wherein the matrix $J_1$ is used to determine new erasures in the parity matrix H and new erased coordinates wherein matrices $H_1$ and $H_2$ are updated, and the updated $H_1$ is provided as feedback to the first matrix constructor circuit; and a calculator circuit that calculates a product $c_1 \in F_q^{n-k}$ that are values that correspond to the erased coordinates of codeword C, from the approximate inverse matrix $J_1$, matrix H2, and $c_2 \in F_q^k$ that is a non-erased part of codeword C.

According to a further embodiment of the disclosure, the hardware architecture of claim 1, wherein the calculator circuit includes a matrix complementor circuit that receives matrix $J_1$ and outputs a matrix $-(J_1)$ that is a complement of matrix $J_1$; a first multiplier circuit that multiplies matrix $-(J_1)$ by matrix $H_2$ over the finite field $F_q$ and outputs a product matrix $-(J_1)H_2$; and a second multiplier circuit that multiplies matrix $-(J_1)H_2$ by $c_2 \in F_q^k$ and outputs product $c_1 \in F_g^{n-k}$.

According to a further embodiment of the disclosure, the neural network calculates the product $\tilde{I}$ of $H_1$ and $J_1$ and determines the new erasures from those elements of $\tilde{I}$ that differ from an identity matrix.

According to a further embodiment of the disclosure, the calculation of matrix $J_1$, the determination of new erasures in the parity matrix H and the erased coordinates, the updating of matrices $H_1$ and $H_2$, and the providing of the updated $H_1$ as feedback to the first matrix constructor circuit are repeated until either the product $\tilde{I}$ is sufficiently close to the identity matrix, according to a predetermined criteria, or a number of new erasures exceeds a predetermined maximum.

According to a further embodiment of the disclosure, the hardware architecture includes a matrix invertor that inverts matrix $H_1$ after the number of new erasures has exceeded the predetermined maximum.

According to a further embodiment of the disclosure, the neural network is dynamically trained by a reinforcement learning algorithm while deployed online.

According to a further embodiment of the disclosure, the neural network is a recurrent neural network.

According to a further embodiment of the disclosure, the neural network is a convolutional neural network.

According to a further embodiment of the disclosure, the neural network is a combined recurrent convolutional neural network.

According to an embodiment of the disclosure, there is provided a method for systematic erasure encoding. The method includes the steps of calculating a matrix $H_1 \in F_q^{(n-k) \times (n-k)}$ from a parity-check matrix $H \in F_q^{(n-k) \times n}$ for an MR codeword C of length n and dimension k over a finite field $F_q$, where q is a prime power, and coordinates of an erased part of codeword C wherein matrix $H_1$ is n-k columns of H located on erased coordinates of code C, calculating matrix $H_2 \in F_q^{(n-k) \times k}$ that is k columns of H located on non-erased coordinates of code C; calculating, by a neural network, a matrix $J_1$ that is an approximate inverse matrix $H_1$, and using the matrix $J_1$ to determine new erasures in the parity matrix H and erased coordinates, update matrices $H_1$ and $H_2$ and providing the updated $H_1$ as feedback for recalculating $J_1$; and calculating a product $c_1 \in F_q^{n-k}$ that are values that correspond to the erased coordinates of codeword C, from the approximate inverse matrix $J_1$, matrix $H_2$, and $c_2 \in F_q^k$ that is a non-erased part of codeword C.

According to a further embodiment of the disclosure, calculating a product $c_1 \in F_q^{n-k}$ includes calculating a complement $-(J_1)$ of matrix $J_1$; multiplying, over the finite field $F_q$, matrix $-(J_1)$ by matrix $H_2$ and outputting product matrix $-(J_1)H_2$, and multiplying, over the finite field $F_q$, product matrix $-(J_1)H_2$ by $c_2 \in F_q^k$ and outputting product $c_1 \in F_q^{n-k}$.

According to a further embodiment of the disclosure, the method includes, by the neural network, calculating the product $\tilde{I}$ of $H_1$ and $J_1$, and determining the new erasures from those elements of $\tilde{I}$ that differ from an identity matrix.

According to a further embodiment of the disclosure, the calculation of matrix $J_1$, the determination of new erasures in the parity matrix H and the erased coordinates, the updating of matrices $H_1$ and $H_2$, and the providing of the updated $H_1$ as feedback to the first matrix constructor circuit are repeated until either the product $\tilde{I}$ is sufficiently close to the identity matrix, according to a predetermined criteria, or a number of new erasures exceeds a predetermined maximum.

According to a further embodiment of the disclosure, the method includes directly inverting matrix $H_1$ after the number of new erasures has exceeded the predetermined maximum.

According to a further embodiment of the disclosure, the neural network is dynamically trained by a reinforcement learning algorithm while deployed online.

According to a further embodiment of the disclosure, the neural network is a recurrent neural network.

According to a further embodiment of the disclosure, the neural network is a convolutional neural network.

According to a further embodiment of the disclosure, the neural network is a combined recurrent convolutional neural network.

According to an embodiment of the disclosure, there is provided a non-transitory program storage device readable by a computer, tangibly embodying a program of instructions executed by the computer to perform method steps for systematic erasure encoding. The method includes the steps of calculating a matrix $H_1 \in F_q^{(n-k) \times (n-k)}$ from a parity-check matrix $H \in F_q^{(n-k) \times n}$ for an MR codeword C of length n and dimension k over a finite field $F_q$, where q is a prime power, and coordinates of an erased part of codeword C, wherein matrix $H_1$ is n−k columns of H located on erased coordinates of code C, calculating matrix $H_2 \in F_q^{(n-k) \times k}$ that is k columns of H located on non-erased coordinates of code C calculating, by a neural network, a matrix $J_1$ that is an approximate inverse matrix $H_1$, and using the matrix $J_1$ to determine new erasures in the parity matrix H and erased coordinates, update matrices $H_1$ and H and providing the updated $H_1$ as feedback for recalculating $J_1$, calculating a complement $-(J_1)$ of matrix $J_1$, multiplying, over the finite field $F_q$, matrix $-(J_1)$ by matrix $H_2$ and outputting product matrix $-(J_1)H_2$, and multiplying, over the finite field $F_q$, product matrix $-(J_1)H_2$ by $c_2 \in F_q^k$ and outputting product $c_1 \in F_q^{n-k}$.

According to a further embodiment of the disclosure, the method includes, by the neural network, calculating the product $\tilde{I}$ of $H_1$ and $J_1$ and determining the new erasures from those elements of $\tilde{I}$ that differ from an identity matrix. The calculation of matrix $J_1$, the determination of new erasures in the parity matrix H and the erased coordinates, the updating of matrices $H_1$ and $H_2$, and the providing of the updated $H_1$ as feedback to the first matrix constructor circuit are repeated until either the product $\tilde{I}$ is sufficiently close to the identity matrix, according to a predetermined criteria, or a number of new erasures exceeds a predetermined maximum. The matrix $H_1$ is directly inverted after the number of new erasures has exceeded the predetermined maximum.

DETAILED DESCRIPTION

Figure 1:
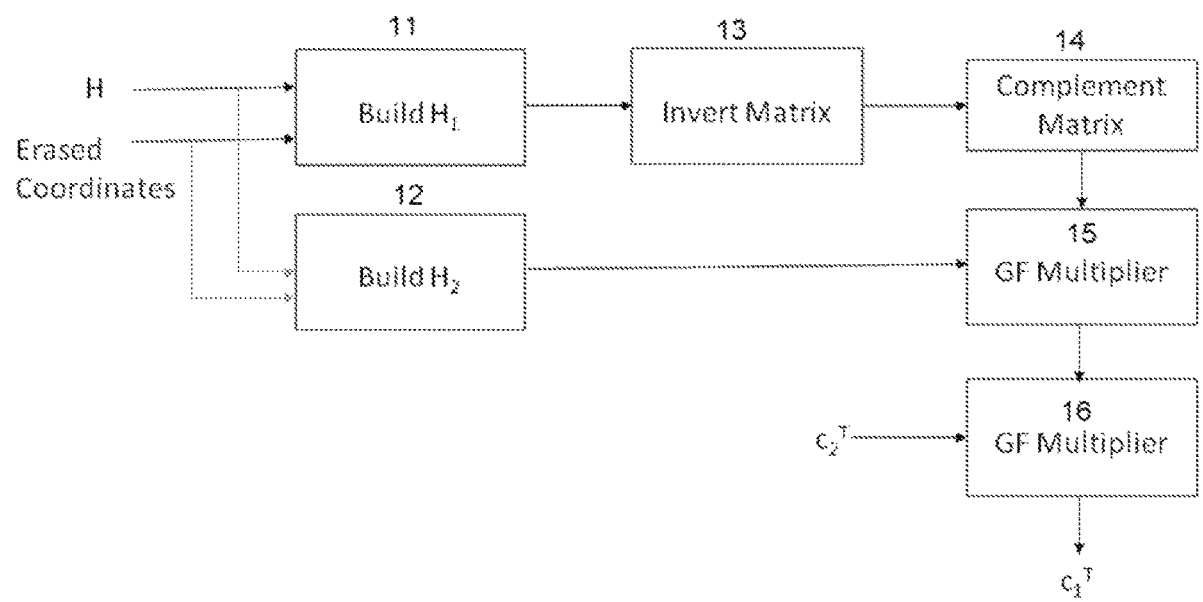
FIG. 1 is a block diagram of a conventional architecture for calculating the erased part of a codeword, according to an embodiment of the disclosure.

Exemplary embodiments of the disclosure as described herein generally provide systems and methods for improved algorithms for erasure correction codes. While embodiments are susceptible to various modifications and alternative forms, specific embodiments thereof are shown by way of example in the drawings and will herein be described in detail. It should be understood, however, that there is no intent to limit the disclosure to the particular forms disclosed, but on the contrary, the disclosure is to cover all modifications, equivalents, and alternatives falling within the spirit and scope of the disclosure.

Let q be a prime power, and $F_q$ be a finite field of q elements.

MR Codes: Informal Background

A locally-recoverable code (LRC) is a code that enables the correction of a small number of erasures by accessing only a small number of code symbols. With this locality property, the goal is to design LRCs that have the maximum possible global erasure-correction capability.

The minimum distance d of an LRC is upper bounded by the famous Singleton-like bound (see, e.g., R. Gopalan, C. Huang, H. Simitci, and S. Yekhanin, "On the locality of codeword symbols", IEEE Trans. Inform. Theory, vol. 58, no. 1, pp. 6925-6934, November 2011.). An LRC achieving this bound with equality is called optimal. Optimal LRCs defined over a finite field of size linear in the length were constructed in I. Tamo and A. Barg, "A family of optimal locally recoverable codes", IEEE Trans. Inform. Theory, vol. 60, no. 8, pp. 4661-4676, August 2014.

Maximally recoverable (MR) codes, also called partial MDS (PMDS) codes, are LRCs characterized by having the inclusion-maximal set of correctable erasure patterns. In particular, an MR code of (global) minimum distance d can correct many erasure patterns with more than d−1 erasures.

Every MR code is an optimal LRC, but not vice-versa. The increased correction capability of MR codes over "plain" optimal LRCs comes at the cost of a field size that is super-linear in the length (S. Gopi, V. Guruswami, and S. Yekhanin, "Maximally recoverable LRCs: A field size lower bound and constructions for few heavy parities", arXiv: 1710.10322v3).

Different constructions of MR codes can correct exactly the same erasure patterns. The main motivation for finding new constructions of MR codes is to reduce the required finite-field size. There is a line of works, e.g., (R. Gabrys, E. Yaakobi, M. Blaum, and P. H. Siegel, "Constructions of partial MDS codes over small fields", in Proc. ISIT 2017), (U. Martinez-Penas and F. K. Kschischang, "Universal and dynamic locally repairable codes with maximal recoverability via sum-rank codes", arXiv:1809.11158v1), that allow the use of smaller finite fields, at least for some of the code parameters.

MR Codes: A Precise Definition

According to an embodiment of the disclosure, for positive integers n, k, r, δ, g, an (n, k, r, δ, g) linear LRC may be a pair (C, I) that includes a linear code C of length n and dimension k over $F_q$, and a partition $I = \{I_1, \ldots, I_g\}$ of $\{1, \ldots, n\}$, having the following properties:

1. For all i, $|I_i| = r+\delta-1$. Hence, $r+\delta-1 = n/g$
2. For all i, the projection of C onto $I_i$ is an [r+δ−1, r, δ] Maximum Distance Separable (MDS) code, where projection of C onto $I_i$ is defined as $\{(c_j)_{j \in I_i} | (c_1, \ldots, c_n) \in C\}$, and an [n, k, d] code is a linear code of length n, dimension k, and minimum Hamming distance d. Note that an MDS code is an [n, k, d] code with d=n−k+1. Since the Singleton bound asserts that d≤n−k+1, MDS codes have the maximum possible distance for their length and dimension.

According to embodiments of the disclosure, the following notations and definitions for LRC/MR codes are used:

The $l_i$ are the local groups of coordinates. Hence, g is the number of local groups.

r is the local dimension (because this is the dimension when projecting to each local group), or just the locality.

r+δ−1=n/g is the local length.

δ is the local distance. It is noted that whenever there are up to δ−1 erasures in a local group, one has to read only r surviving coordinates from the local group to correct the erasures. This justifies the name "locally-recoverable code".

On top of the g·(δ−1) parity checks contributed by the local constraints, there are h additional heavy (global)

parities, so that the total number n−k of parity symbols is given by n−k=g(δ−1)+h.

When using LRCs, a first goal is to maximize the global distance, that is, the minimum distance d of C. A more ambitious goal is to let C be able to decode as many global erasure patterns as possible, even patterns of more than d−1 erasures.

Motivation

In a typical situation, there is a small enough number of local erasures in a single local group, so that one only has to read data from one local group. This is important in saving bandwidth in distributed storage systems. However, one would also like to be able to correct in the rare events where there are many erasures, and local decoding is not enough. For this, it would be useful to maximize the global erasure correction capability.

An MR code is an LRC as above that can correct any global erasure pattern that has the following properties:

There are up to δ−1 erasures in each local group+ up to h additional arbitrary erasures.

Put differently, if $e_i$ is the number of erasures in local group i, then $\Sigma_i(e_i-(\delta-1))^+ \leq h$, where $x^+ := \max\{x, 0\}$.

It can be shown that this is the inclusion-wise maximum set of correctable erasure patterns for an (n, k, r, δ, g) LRC. Hence MR codes achieve the maximum possible erasure-correction capability for an LRC. This justifies the name "maximally recoverable code".

Note that the maximum number of erasures correctable by an MR code is g(δ−1)+h, which equals n−k. Hence, an MR code can correct some erasure patterns with n−k erasures, as opposed to an MDS code that can correct all such patterns. Since MDS codes are not required to be LRCs, they can correct more global erasure patterns, but they do not have the locality property. The fact that an MR code can correct some (and in some cases, most) patterns with n−k erasures justifies the name "partial MDS code".

Global Erasure Decoding Algorithm for any MR Code

According to an embodiment, it will be assumed that the number of erasures is maximal, that is, that $\Sigma_i(e_i-(\delta-1))^+ = h$ (using the above notation), so that the number of erasures equals n−k. It is sufficient to consider this case, because if there are fewer erasures, then one can virtually erase additional coordinates and return to this case.

Suppose that there is a parity-check matrix $H \in F_q^{(n-k)\times n}$ for the MR code C. Let $H_1 \in F_q^{(n-k)\times(n-k)}$ be the n−k columns of H located on erased coordinates, and let $H_2 \in F_q^{(n-k)\times k}$ be the k columns of H located on the non-erased coordinates. By the definition of an MR code, $H_1$ is invertible. Let the transmitted codeword be $c=(c_1, c_2)$, where $c_1 \in F_q^{n-k}$ is the erased part, and $c_2 \in F_q^k$ is the non-erased part. Then, since $Hc^T=0$ (where $(\bullet)^T$ stands for transposition), the erased part can be calculated by $$c_1^T = -(H_1)^{-1} H_2 c_2^T \quad (1)$$

Note that all the vectors and matrices appearing on the right-hand side are known, and this formula is a method for erasure decoding.

FIG. 1 is a block diagram of an architecture for calculating EQ. (1), above. Referring to the figure, both the parity matrix H and the erased coordinates are provided as input to block 11, which calculates matrix $H_1$, and to block 12, which calculates matrix $H_2$. Matrix $H_1$, which is output by block 11, is provided as input to block 13, which outputs $(H_1)^{-1}$, the inverse of $H_1$, to block 14, which outputs $-(H_1)^{-1}$, the complement of $H_1^{-1}$. Matrices $H_2$ and $-(H_1)^{-1}$ are provided as input to block 15, which multiplies them over a finite Galois field and outputs $-(H_1)^{-1}H_2$. Block 16 then multiplies over a finite Galois field the output $-(H_1)^{-1}H_2$ from block 15 by the transpose of the non-erased part of the code word, $c_2^T$, and outputs the transpose of the erased part $c_1^T$. Note that the matrix inversion block, block 13, is a bottleneck with regard to accelerating performance, throughput, and enhancing computational load.

Systematic Encoding Algorithm for any MR Code

Recall that encoding is the process of mapping a vector of k information symbols into a codeword, where different vectors are mapped to different codewords. An encoding is called systematic if the k information symbols appear on some k fixed coordinates of the corresponding codeword. Put differently, in systematic encoding we just append n−k parity symbols to the k information symbols in order to obtain a codeword.

Since n−k=g(δ−1)+h, one can fix once and for all one erasure pattern correctable by the MR code to hold the parity symbols, and then use erasure decoding as in EQ. (1) to calculate the n−k parity symbols. Here, $c_2$ in the equation is the free information vector, while $c_1$ is the calculated parity.

As opposed to erasure decoding, where the erased coordinates may differ from pattern to pattern, in systematic encoding there is one pre-determined erasure pattern. Hence, one can calculate and store in advance the matrix $A=-(H_1)^{-1} H_2 \in F_q^{(n-k)\times k}$ appearing in EQ. (1), and systematic encoding is performed by calculating the parity symbols as $c_1^T = A \cdot c_2^T$.

New Architecture for Calculating $c_1^T = -(H_1)^{-1} H_2 c_2^T$

Figure 2:
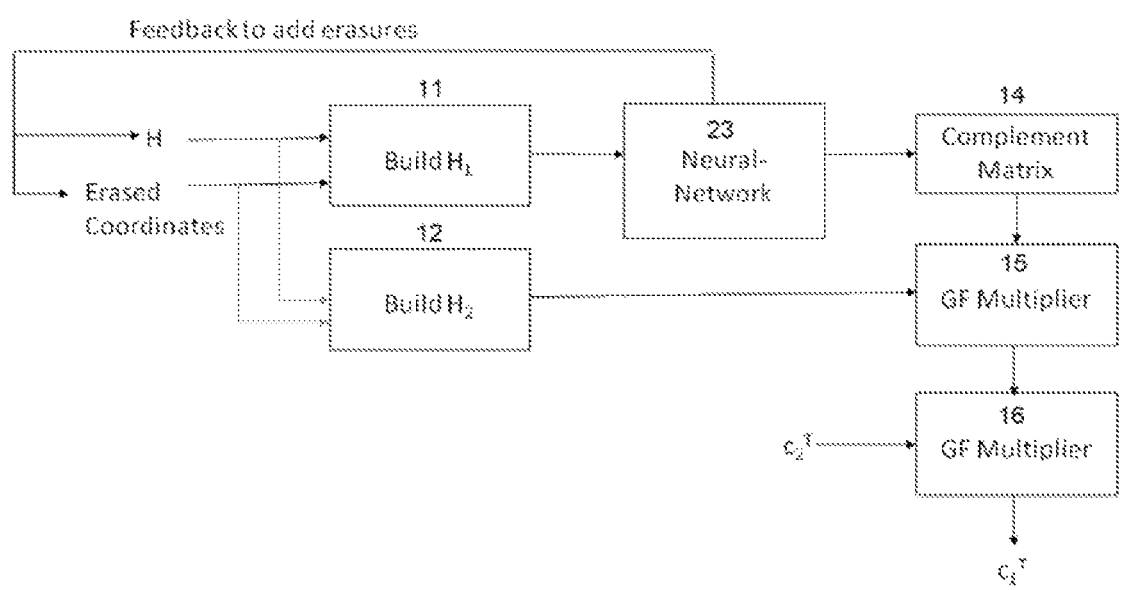
FIG. 2 is a block diagram of a new architecture for calculating the erased part of a codeword that uses a neural network to perform matrix inversion, according to an embodiment of the disclosure

FIG. 2 is a block diagram of a new architecture according to an embodiment for calculating EQ. (1), above, where like numbers refer to like components. The architecture of claim 2 is similar to that of claim 1 except that the matrix inversion block 13 has been replaced by a neural network (NN) block 23 that has been trained to invert parity matrix $H_1$. The neural network is just a one-pass calculation structure that is simple to implement compared to matrix inverse hardware, and can also be used in a pipeline configuration to accelerate the speedup even more. However, the output of the NN block is not an exact inverse of $H_1$, but rather only an approximate inverse. The neural network is trained with data set of (input=matrix, output=inverse matrix). After training, the neural network is presented with a matrix input that was not on the training set, and it outputs that may be the exact or approximate inverse matrix. Consider two matrices, B and C. Their inverses are $B^{-1}$ and $C^{-1}$. The matrix $C^{-1}$ is an approximate inverse of B if the number of index differences between B and C is low, e.g. two. This approximate inverse will contain additional artificial erasures that are artificial in the sense that the bit values of the coordinate of the artificial erasure is actually known. To see how, let the neural network output $C^{-1}$ be an approximate inverse of B. To use $C^{-1}$, mark some of the indicies in B, which are different from C, as erasures, so that now $C^{-1}$ is exact inverse of BL. The change of the B matrix is performed through feedback from neural network output of $C^{-1}$. Since B was changed, and now that $C^{-1}$ is an exact inverse, the rest of the algorithm can continue. This approximate inverse is feedback and appended to the erased coordinates that are provided as input to blocks 11 and 12. This process of calculating an approximate inverse of $H_1$ and appending it as feedback to the erased coordinates accelerates the process of calculating the inverse of $H_1$. An issue with using a NN trained to invert the parity matrix $H_1$ is that there is a tradeoff between the size of the NN and the speedup, in that a bigger NN can more exactly calculate the matrix inverse, which provides a bigger speedup, but at the cost of requiring more computational resources. As the neural network uses more layers and more vertices, the inverse calculation is more exact with a reduced probability for errors.

More specifically, consider an input stream of codewords i, each with an associated parity matrix $H_i$. Let the output of the NN 23 for the matrix $H_{i,1}$ that corresponds to a current codeword be denoted as $J_{i,1}^{-1}$. If $J_{i,1}^{-1}$ is an exact inverse of $H_{i,1}$, their product should be the identity matrix I. However, since $J_{i,1}^{-1}$ is only an approximate inverse of $H_{i,1}$, their matrix product $\tilde{I}$ will differ from the identity matrix I in up to two ways: an element on the main diagonal will be unequal to one, or an off-diagonal element will be non-zero. In either case, since each element of the identity matrix I is an inner product of row in one of the factors and a column in the other factor, one marks the row of $H_i$ for the current codeword that corresponds to the column of $J_{i,1}^{-1}$ as being erasures, and also the corresponding coordinates in the codeword as being erasures. The feedback is then used to recalculate $H_{i,1}$, $H_{i,2}$ and the non-erased part of the codeword $c_{i,2}$, and the recalculated $H_{i,1}$, is provided to the NN 23, and an updated approximate inverse $J_{i,1}^{-1}$ is calculated. This process is repeated for the current codeword until the product $\tilde{I}$ of $H_{i,1}$ and $J_{i,1}^{-1}$ converges sufficiently close to the exact inverse I, according to a predetermined criteria.

However, it may be seen that the number of erasures increases with each iteration through the NN 23. In a worst case scenario, the number of erasures may become unacceptably large before the approximate inverse $\tilde{I}$ has converged sufficiently close to the exact inverse I. The criteria for "unacceptably large" is based on customer specification of a data transfer rate. For example, a codeword length can vary from 100 bits to thousands of bits, and the upper limit for the number of bit erasures can vary from 5% to 10% up to 50% of the bitlength of the codeword. When this scenario occurs, the matrix inversion of $H_{i,1}$ is performed by a conventional matrix block, such as block 13 in FIG. 1.

A neural network according to embodiments can be implemented in various ways, and trained by a machine-learning algorithm such as those known in the art. For example, a neural network according to an embodiment can be trained by a dynamic training algorithm, i.e., online while deployed, by a reinforcement-learning algorithms. An exemplary reinforcement-learning algorithm is a soft actor-critic algorithm. In addition, a neural network can be a recurrent neural network (RNN), which is effective for feedback processing. An exemplary RNN is a long short-term memory (LSTM) RNN. A neural network can also be a convolutional neural network (CNN), which is effective to detect the location of the erasure. An RNN and a CNN can be combined.

An erasure correction algorithm according to embodiments can be used in both a NAND-flash solid-state drive (SSD) or a hard disk drive (HDD), and is also suitable for use in any emerging memory or storage technology. An erasure correction algorithm according to embodiments can be encoded in the SSD or HDD itself, or could be decentralized, i.e., not encoded in the SSD or HDD. The erasure correction can be implemented hierarchically, with an erasure correction algorithm inside of an erasure correction algorithm that calls itself recursively.

System Implementations

It is to be understood that embodiments of the present disclosure can be implemented in various forms of hardware, software, firmware, special purpose processes, or a combination thereof. In one embodiment, the present disclosure can be implemented in hardware as an application-specific integrated circuit (ASIC), or as a field programmable gate array (FPGA). In another embodiment, the present disclosure can be implemented in software as an application program tangible embodied on a computer readable program storage device. The application program can be uploaded to, and executed by, a machine comprising any suitable architecture.

Figure 3:
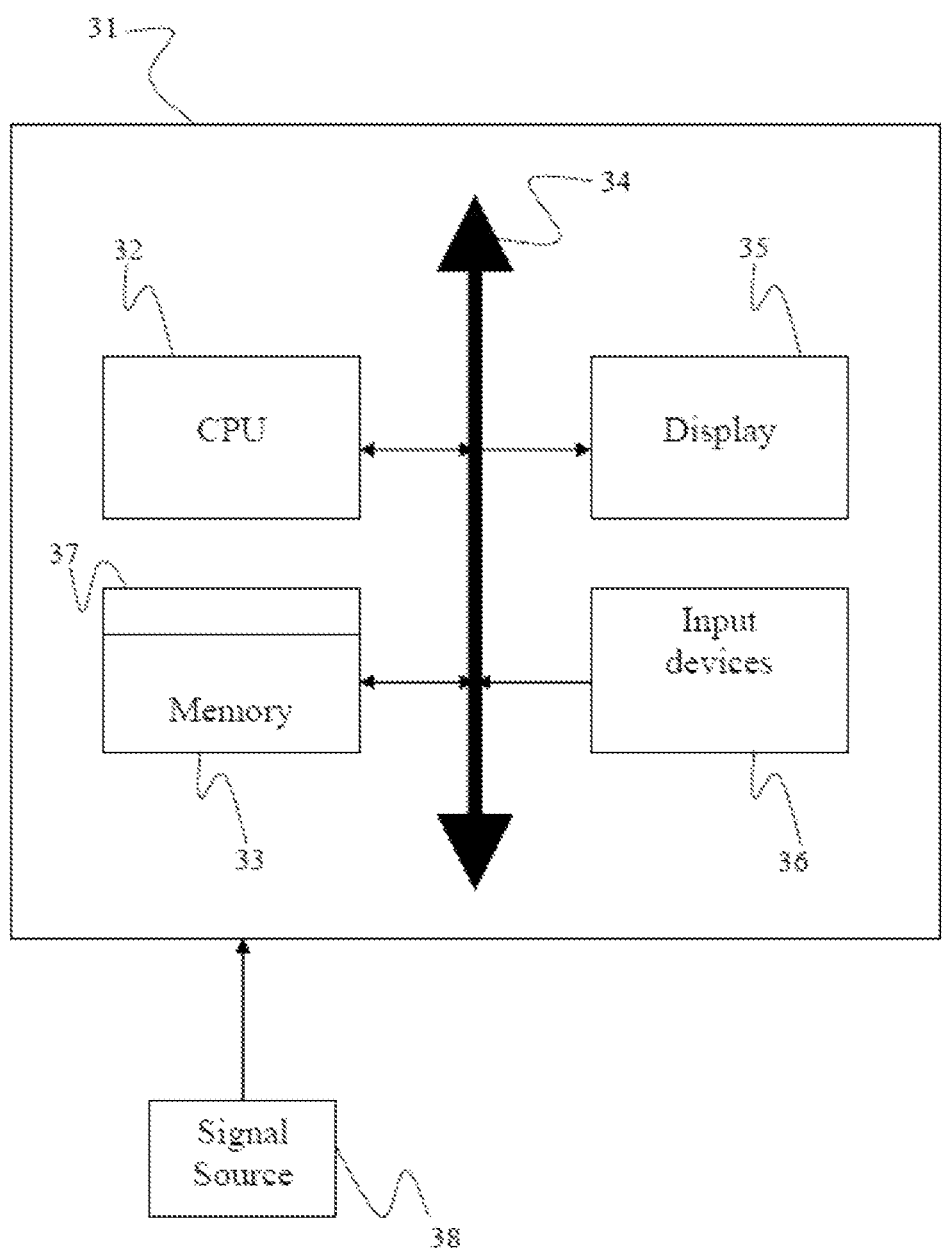
FIG. 3 is a block diagram of a system for implementing an erasure correction algorithm that uses a neural network to perform matrix inversion, according to an embodiment of the disclosure.

FIG. 3 is a block diagram of a system for implementing an erasure correction algorithm that uses a neural network to perform matrix inversion, according to an embodiment of the disclosure. Referring now to FIG. 3, a computer system 31 for implementing the present disclosure can comprise, inter alia, a central processing unit (CPU) or controller 32, a memory 33 and an input/output (I/O) interface 34. The computer system 31 is generally coupled through the I/O interface 34 to a display 35 and various input devices 36 such as a mouse and a keyboard. The support circuits can include circuits such as cache, power supplies, clock circuits, and a communication bus. The memory 33 can include random access memory (RAM), read only memory (ROM), disk drive, tape drive, etc., or a combinations thereof. The present disclosure can be implemented as a routine 37 that is stored in memory 33 and executed by the CPU or controller 32 to process the signal from the signal source 38. As such, the computer system 31 is a general purpose computer system that becomes a specific purpose computer system when executing the routine 37 of the present disclosure. Alternatively, as described above, embodiments of the present disclosure can be implemented as an ASIC or FPGA 37 that is in signal communication with the CPU or controller 32 to process the signal from the signal source 38.

The computer system 31 also includes an operating system and micro instruction code. The various processes and functions described herein can either be part of the micro instruction code or part of the application program (or combination thereof) which is executed via the operating system. In addition, various other peripheral devices can be connected to the computer platform such as an additional data storage device and a printing device.

It is to be further understood that, because some of the constituent system components and method steps depicted in the accompanying figures can be implemented in software, the actual connections between the systems components (or the process steps) may differ depending upon the manner in which the present disclosure is programmed. Given the teachings of the present disclosure provided herein, one of ordinary skill in the related art will be able to contemplate these and similar implementations or configurations of the present disclosure.

While the present disclosure has been described in detail with reference to exemplary embodiments, those skilled in the art will appreciate that various modifications and substitutions can be made thereto without departing from the spirit and scope of the disclosure as set forth in the appended claims.

What is claimed is:

1. A digital electronic circuit for systematic erasure encoding, comprising:
    a first matrix constructor circuit that receives a parity-check matrix $H \in F_q^{(n-k) \times n}$ for an MR codeword C of length n and dimension k over a finite field $F_q$, where q is a prime power, and receives coordinates of an erased part of codeword C, and outputs a matrix $H_1 \in F_q^{(n-k) \times (n-k)}$ that is n–k columns of H located on erased coordinates of code C;
    a second matrix constructor circuit that receives the parity check matrix H and the coordinates of the erased part of codeword C and outputs a matrix $H_2 \in F_q^{(n-k) \times k}$ that is k columns of H located on non-erased coordinates of code C;

a neural network that receives matrix $H_1$ and outputs a matrix $J_1$ that is an approximate inverse of matrix $H_1$, wherein the matrix $J_1$ is used to determine new erasures in the parity matrix H and new erased coordinates wherein matrices $H_1$ and $H_2$ are updated, and the updated $H_1$ is provided as feedback to the first matrix constructor circuit; and a calculator circuit that calculates a product $c_1 \in F_q^{n-k}$ that are values that correspond to the erased coordinates of codeword C, from the approximate inverse matrix $J_1$, matrix $H_2$, and $c_2 \in F_q^k$ that is a non-erased part of codeword C.

2. The digital electronic circuit of claim 1, wherein the calculator circuit comprises:

a matrix complementor circuit that receives matrix $J_1$ and outputs a matrix $-(J_1)$ that is a complement of matrix $J_1$;

a first multiplier circuit that multiplies matrix $-(J_1)$ by matrix $H_2$ over the finite field $F_q$ and outputs a product matrix $-(J_1)H_2$; and a second multiplier circuit that multiplies matrix $-(J_1)H_2$ by $c_2 \in F_q^k$ and outputs product $c_1 \in F_q^{n-k}$.

3. The digital electronic circuit of claim 1, wherein the neural network calculates the product $\tilde{I}$ of $H_1$ and $J_1$ and determines the new erasures from those elements of $\tilde{I}$ that differ from an identity matrix.

4. The digital electronic circuit of claim 1, wherein the calculation of matrix $J_1$, the determination of new erasures in the parity matrix H and the erased coordinates, the updating of matrices $H_1$ and $H_2$, and the providing of the updated $H_1$ as feedback to the first matrix constructor circuit are repeated until either the product $\tilde{I}$ is sufficiently close to the identity matrix, according to a predetermined criteria, or a number of new erasures exceeds a predetermined maximum.

5. The digital electronic circuit of claim 4, further comprising a matrix invertor that inverts matrix $H_1$ after the number of new erasures has exceeded the predetermined maximum.

6. The digital electronic circuit of claim 1, wherein the neural network is dynamically trained by a reinforcement learning algorithm while deployed online.

7. The digital electronic circuit of claim 1, wherein the neural network is a recurrent neural network.

8. The digital electronic circuit of claim 1, wherein the neural network is a convolutional neural network.

9. The digital electronic circuit of claim 1, wherein the neural network is a combined recurrent convolutional neural network.

10. A method for systematic erasure encoding, comprising the steps of:

reading a codeword from a memory device;

performing erasure correction on the codeword to generate a corrected codeword; and outputting data included in the corrected codeword, wherein performing the erasure correction comprises:

calculating a matrix $H_1 \in F_q^{(n-k) \times (n-k)}$ from a parity-check matrix $H \in F_q^{(n-k) \times n}$ for an MR codeword C of length n and dimension k over a finite field $F_q$, where q is a prime power, and coordinates of an erased part of codeword C, wherein matrix $H_1$ is n–k columns of H located on erased coordinates of code C;

calculating matrix $H_2 \in F_q^{(n-k) \times k}$ that is k columns of H located on non-erased coordinates of code C;

calculating, by a neural network, a matrix $J_1$ that is an approximate inverse of matrix $H_1$, and using the matrix $J_1$ to determine new erasures in the parity matrix H and new erased coordinates, update matrices $H_1$ and $H_2$ and providing the updated $H_1$ as feedback for recalculating $J_1$; and calculating a product $c_1 \in F_q^{n-k}$ that are values that correspond to the erased coordinates of codeword C, from the approximate inverse matrix $J_1$, matrix $H_2$, and $c_2 \in F_q^k$ that is a non-erased part of codeword C.

11. The method of claim 10, wherein calculating a product $c_1 \in F_q^{n-k}$ comprises:

calculating a complement $-(J_1)$ of matrix $J_1$;

multiplying, over the finite field $F_q$, matrix $-(J_1)$ by matrix $H_2$ and outputting product matrix $-(J_1)H_2$; and multiplying, over the finite field $F_q$, product matrix $-(J_1)H_2$ by $c_2 \in F_q^k$ and outputting product $c_1 \in F_q^{n-k}$.

12. The method of claim 10, further comprising, by the neural network, calculating the product $\tilde{I}$ of $H_1$ and $J_1$ and determining the new erasures from those elements of $\tilde{I}$ that differ from an identity matrix.

13. The method of claim 10, wherein the calculation of matrix $J_1$, the determination of new erasures in the parity matrix H and the erased coordinates, the updating of matrices $H_1$ and $H_2$, and the providing of the updated $H_1$ as feedback to the first matrix constructor circuit are repeated until either the product $\tilde{I}$ is sufficiently close to the identity matrix, according to a predetermined criteria, or a number of new erasures exceeds a predetermined maximum.

14. The method of claim 13, further comprising directly inverting matrix $H_1$ after the number of new erasures has exceeded the predetermined maximum.

15. The method of claim 10, wherein the neural network is dynamically trained by a reinforcement learning algorithm while deployed online.

16. The method of claim 10, wherein the neural network is a recurrent neural network.

17. The method of claim 10, wherein the neural network is a convolutional neural network.

18. The method of claim 10, wherein the neural network is a combined recurrent convolutional neural network.

19. A non-transitory program storage device readable by a computer, tangibly embodying a program of instructions executed by the computer to perform method steps for systematic erasure encoding, the method comprising the steps of:

reading a codeword from a memory device;

performing erasure correction on the codeword to generate a corrected codeword; and outputting data included in the corrected codeword, wherein performing the erasure correction comprises:

calculating a matrix $H_1 \in F_q^{(n-k) \times (n-k)}$ from a parity-check matrix $H \in F_q^{(n-k) \times n}$ for an MR codeword C of length n and dimension k over a finite field $F_q$, where q is a prime power, and coordinates of an erased part of codeword C, wherein matrix $H_1$ is n–k columns of H located on erased coordinates of code C;

calculating matrix $H_2 \in F_q^{(n-k) \times k}$ that is k columns of H located on non-erased coordinates of code C;

calculating, by a neural network, a matrix $J_1$ that is an approximate inverse matrix $H_1$, and using the matrix $J_1$ to determine new erasures in the parity matrix H and new erased coordinates, update matrices $H_1$ and $H_2$ and providing the updated $H_1$ as feedback for recalculating $J_1$;

calculating a complement $-(J_1)$ of matrix $J_1$;

multiplying, over the finite field $F_q$, matrix $-(J_1)$ by matrix $H_2$ and outputting product matrix $-(J_1)H_2$; and multiplying, over the finite field $F_q$, product matrix $-(J_1)H_2$ by $c_2 \in F_q^k$ and outputting product $c_1 \in F_o^{n-k}$.

20. The non-transitory computer readable program storage device of claim 19, the method further comprising, by the neural network, calculating the product $\tilde{I}$ of $H_1$ and $J_1$ and determining the new erasures from those elements of $\tilde{I}$ that differ from an identity matrix, wherein the calculation of matrix $J_1$, the determination of new erasures in the parity matrix H and the erased coordinates, the updating of matrices $H_1$ and $H_2$, and the providing of the updated $H_1$ as feedback to the first matrix constructor circuit are repeated until either the product $\tilde{I}$ is sufficiently close to the identity matrix, according to a predetermined criteria, or a number of new erasures exceeds a predetermined maximum, wherein the matrix $H_1$ is directly inverted after the number of new erasures has exceeded the predetermined maximum.

\* \* \* \* \*